United States Patent [19]
Tamura et al.

[11] Patent Number: 6,093,290
[45] Date of Patent: Jul. 25, 2000

[54] METHOD OF GENERATING A RECIPROCATING PLURALITY OF MAGNETIC FLUXES ON A TARGET

[75] Inventors: Hideo Tamura, Nara; Yasushi Fujioka, Soraku-gun; Masahiro Kanai, Soraku-gun; Akira Sakai, Soraku-gun, all of Japan

[73] Assignee: Canon Kabushiki Kaisha, Tokyo, Japan

[21] Appl. No.: 09/076,238

[22] Filed: May 12, 1998

[30] Foreign Application Priority Data

May 14, 1997 [JP] Japan ................................. 9-123990

[51] Int. Cl.⁷ .................................................. C23C 14/34
[52] U.S. Cl. .............................. 204/192.12; 204/192.13; 204/298.2; 204/298.23; 204/298.24
[58] Field of Search ........................ 204/192.12, 298.16, 204/298.17, 298.18, 298.19, 298.2, 298.23, 298.24, 298.37, 192.13, 298.03

[56] References Cited

U.S. PATENT DOCUMENTS

| | | | |
|---|---|---|---|
| 4,322,276 | 3/1982 | Meckel et al. | 204/298.24 |
| 4,426,275 | 1/1984 | Meckel et al. | 204/298.19 |
| 4,434,037 | 2/1984 | Crank | 204/298.2 |
| 4,441,974 | 4/1984 | Nishikawa et al. | 204/298.19 |
| 4,714,536 | 12/1987 | Freeman et al. | 204/298.2 |
| 5,114,770 | 5/1992 | Echizen et al. | 427/38 |
| 5,130,170 | 7/1992 | Kanai et al. | 427/38 |
| 5,178,743 | 1/1993 | Kumar | 204/298.24 |
| 5,229,358 | 7/1993 | Kumar | 204/298.24 |
| 5,512,156 | 4/1996 | Yamanishi et al. | 204/298.2 |
| 5,833,815 | 11/1998 | Kim et al. | 204/298.2 |

Primary Examiner—Nam Nguyen
Assistant Examiner—Gregg Cantelmo
Attorney, Agent, or Firm—Fitzpatrick, Cella, Harper & Scinto

[57] ABSTRACT

The sputtering method of the present invention comprises the steps of forming a plurality of tunnel-like magnetic fluxes on a target, forming an electric field between the target and a belt-like substrate, and conveying the belt-like substrate while reciprocating the plurality of tunnel-like magnetic fluxes at least in the direction of conveying the belt-like substrate, wherein the speed v of conveying the substrate, the distance L in the direction of conveying the belt-like substrate between two adjacent points where the magnetic field of the plurality of tunnel-like magnetic fluxes and the electric field cross each other at a right angle, and the period T of the reciprocating motion of the plurality of tunnel-like magnetic fluxes are controlled so as to $L/v=(n+½)T$ wherein n is $z-1/16<n<z+1/16$ and z is an integer equal to or greater than 0. The present method can solve the problem of the prior art that when a sputtering apparatus is applied to a roll-to-roll system magnetron sputtering apparatus, any part of a belt-like substrate is subjected to sputtering for a different sputtering time, thereby deteriorating the distribution of film thickness in the direction of conveying the belt-like substrate.

7 Claims, 9 Drawing Sheets

MOVEMENT DIRECTION OF BELT-LIKE SUBSTRATE →

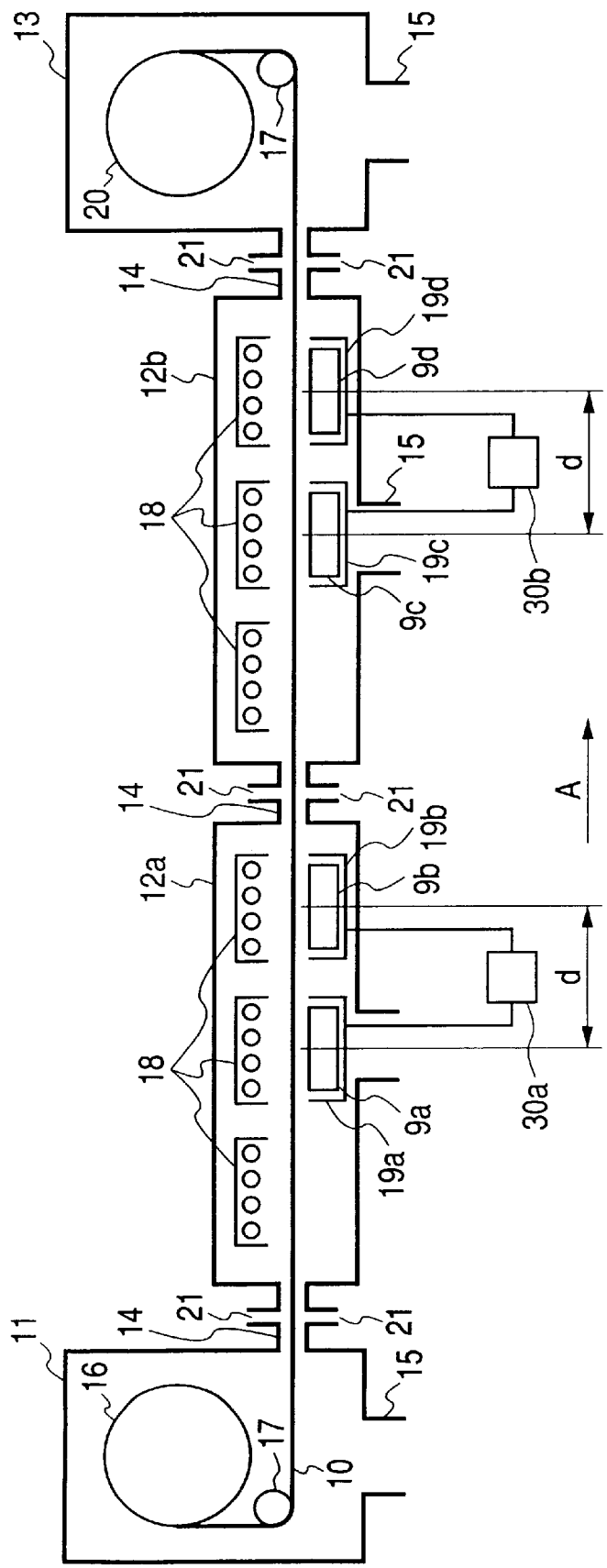

METHOD OF GENERATING A RECIPROCATING PLURALITY OF MAGNETIC FLUXES ON A TARGET

BACKGROUND OF THE INVENTION

1. Field of the Invention

The present invention relates to a sputtering method of continuously forming a film on a belt-like substrate while the substrate is moved, and to a method of producing a photovoltaic device using the sputtering method.

2. Related Background Art

In the magnetron sputtering technique, a plasma focusing magnet generates a magnetic flux in the form of a tunnel, and electrons generated by ionization as well as secondary electrons generated by sputtering are captured by the tunnel-like magnetic flux in the vicinity of the surface of a target. As a result, there are a high density of electrons near the surface of the target. This brings about a high probability of collision between the electrons and neutral gas molecules, thereby increasing the plasma density. Therefore, the magnetron sputtering technique has advantages that the speed of forming a film by sputtering is high and that a substrate on which a film is formed is not damaged by bombardment of high-energy secondary electrons because the electrons are confined in the vicinity of the target surface by the magnetic field. However, the density of plasma increases on a local portion of the target surface, whereby erosion of the local portion is enlarged by sputtering, whereby the target is not used uniformly. Therefore, the magnetron sputtering technique has a problem that the target is used with a low efficiency.

In order to expand the region of the target subjected to sputtering to improve the use efficiency of the target, the following techniques are known. (1) The magnet assembly for generating the magnetic field is mechanically moved. (2) The location of the plasma is moved by controlling the distribution of effective magnetic flux density using a combination of magnets. (3) The magnet assembly is modified to improve the distribution of magnetic flux in the region near the target, thereby expanding the plasma region.

Japanese Patent Application Publication No. 3-51788 discloses that a plasma focusing magnet is disposed at the back side of a target, a flux guide typically made of permalloy is disposed between the target and the magnet, and the flux guide is rocked to move the concentrated region of the magnetic flux.

FIG. 8 is a cross-sectional view for showing an example of a magnetron sputtering apparatus including a magnet assembly adapted to be mechanically moved. In FIG. 8, a target 1 is disposed on a target cooling plate 2 such that they are in intimate contact with each other. At the back side of the cooling plate 2 (i.e., the side opposite to the side of locating the target), there is disposed a magnet assembly 6 including permanent magnets 3 and 4 and a permanent magnet supporting member 5. The adjacent magnets 3 and 4 disposed on the side of the cooling plate 2 have magnetic poles opposite to each other such that lines of magnetic force emerging from the magnet assembly 6 returns to the magnet assembly 6 after passing through the surface region of the target 1, that is, a closed loop shape of tunnel-like magnetic flux is formed as shown by broken lines in FIG. 8. To increase the utilization efficiency of the target 1, the tunnel-like magnetic flux is rocked by moving the magnet assembly 6 along a circular path (means for moving the magnet is not shown in FIG. 8). A negative DC voltage or a high frequency voltage is applied to the target 1 (from a power supply not shown in FIG. 8) to generate a plasma, thereby sputtering the target.

As the method of successively forming functional deposited films of a photovoltaic device on a belt-like substrate, there is proposed a method of arranging a plurality of deposition chambers independent from one another and forming respective semiconductor layers in the respective deposition chambers. U.S. Pat. No. 4,400,409 discloses a continuous plasma CVD apparatus employing a roll-to-roll system. In this apparatus, a plurality of glow discharging regions are arranged. A flexible substrate with a sufficiently large length and a desired width is continuously moved in a longitudinal direction such that it is passed through the plurality of glow discharging regions from one region to another and depositing respective semiconductor layers of desired electroconductive types when it passes through the respective glow discharging regions. This technique makes it possible to continuously produce devices having semiconductor junctions. In the patent cited above, dopant gases used in each step of the semiconductor layer production are isolated from one another by gas gates so as to prevent the dopant gases from diffusing from one region into another thus preventing the glow discharging regions from being contaminated. More specifically, the glow discharging regions are isolated from each other by slit-like isolation paths through which isolation gas such as Ar or $H_2$ is passed.

However, when such a roll-to-roll system is implemented with magnetron sputtering apparatus of the type described above, the speed of the tunnel-like magnetic flux varies as a sine wave in the direction of moving the belt-like substrate because the magnet assemblies are moved along circular paths while the belt-like substrate is moved at a constant speed. In other words, the speed of the tunnel-like magnetic flux has alternately positive and negative values. As a result, the sputtering time varies depending on the location of the plate-like substrate. This bring about nonuniformity of the film thickness along the direction of moving belt-like substrate.

SUMMARY OF THE INVENTION

According to an aspect of the present invention, there is provided a sputtering method comprising the steps of forming a plurality of tunnel-like magnetic fluxes on a target, forming an electric field between the target and a belt-like substrate, and conveying the belt-like substrate while reciprocating the plurality of tunnel-like magnetic fluxes at least in the direction of conveying the belt-like substrate, wherein the speed v of conveying the substrate, the distance L in the direction of conveying the belt-like substrate between two adjacent points where the magnetic field of the plurality of tunnel-like magnetic fluxes and the electric field cross each other at a right angle, and the period T of the reciprocating motion of the plurality of tunnel-like magnetic fluxes are controlled so as to satisfy $L/v=(n+\frac{1}{2})T$ wherein n is $z-\frac{1}{16}<n<z+\frac{1}{16}$ and z is an integer equal to or greater than 0.

According to another aspect of the invention, there is provided a sputtering method comprising the steps of forming a plurality of tunnel-like magnetic fluxes of a closed loop shape on a target, forming an electric field between the target and a belt-like substrate, and conveying the belt-like substrate while reciprocating the plurality of tunnel-like magnetic fluxes at least in the direction of conveying the belt-like substrate, wherein the speed v of conveying the substrate, the interval p of disposing the plurality of closed loops, and the period T of the reciprocating motion of the plurality of tunnel-like magnetic fluxes are controlled so as to satisfy $p/v=(n+1/m_1)T$ wherein n is $z-1/(8m_1)<n<z+1/(8m_1)$, z is an integer equal to or greater than 0, and $m_1$ is a number of closed loops mutually canceling nonuniformity.

According to still another aspect of the invention, there is provided a sputtering method comprising the steps of forming a tunnel-like magnetic flux on a target, forming an electric field between the target and a belt-like substrate, and conveying the belt-like substrate while reciprocating the tunnel-like magnetic flux at least in the direction of conveying the belt-like substrate, wherein the target is present in plurality and the plurality of targets reciprocate independent of one another, and wherein the speed v of conveying the substrate, the distance d between two adjacent centers of the plurality of independently reciprocating targets, and the period T of the reciprocating motion of the tunnel-like magnetic flux are controlled so as to satisfy $d/v=(n+1/m_2)T$ wherein n is $z-1/(8m_2)<n<z+1/(8m_2)$, z is an integer equal to or greater than 0, and $m_2$ is a number of targets mutually canceling nonuniformity.

BRIEF DESCRIPTION OF THE DRAWINGS

FIG. 11 is a schematically cross-sectional view for showing another roll-to-roll system sputtering apparatus according to the present invention.

DESCRIPTION OF THE PREFERRED EMBODIMENTS

First Embodiment

Figure 1:
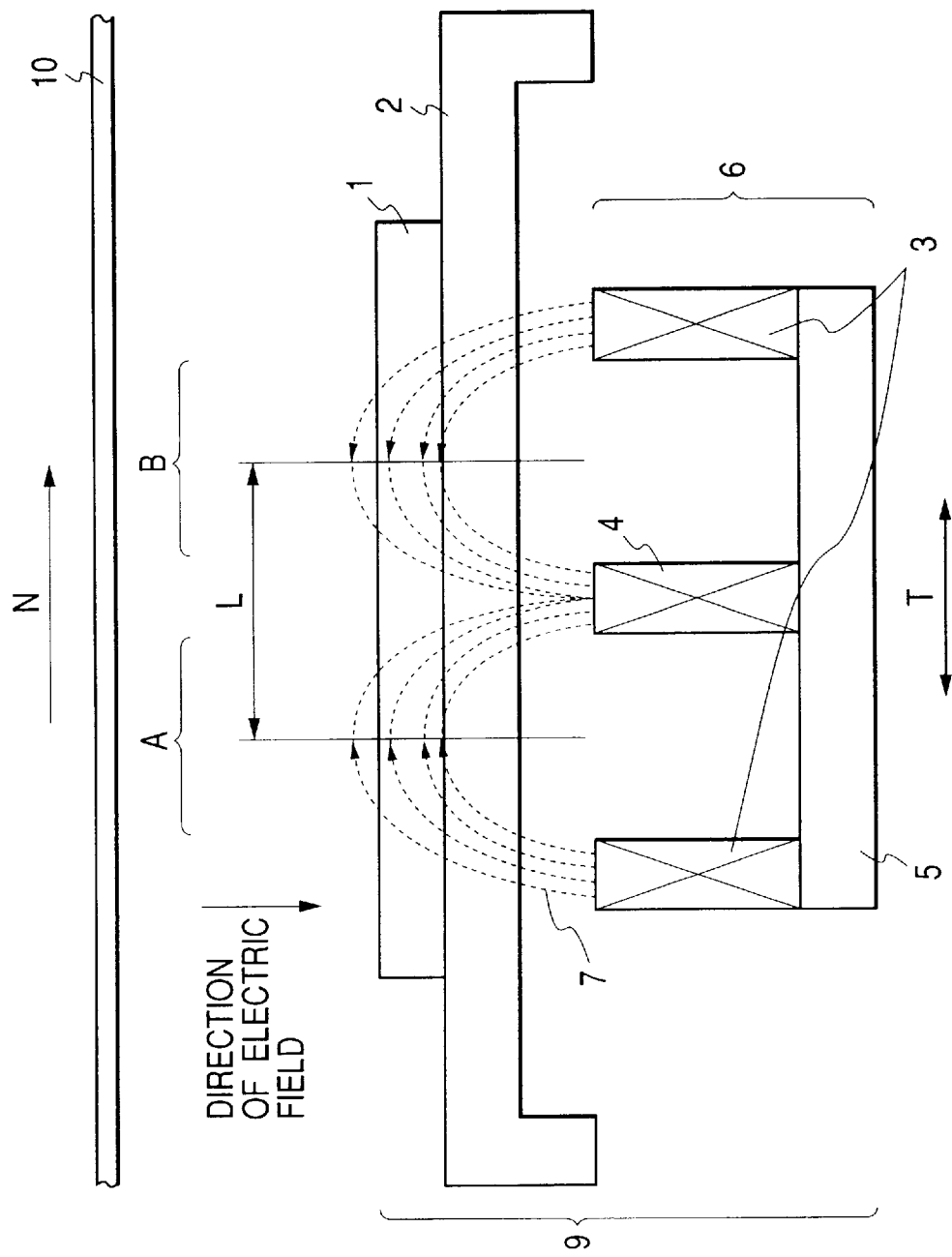
FIG. 1 is a schematically cross-sectional view for showing a cathode unit according to the present invention, taken along the line 1—1 of FIG. 2.
Figure 2:
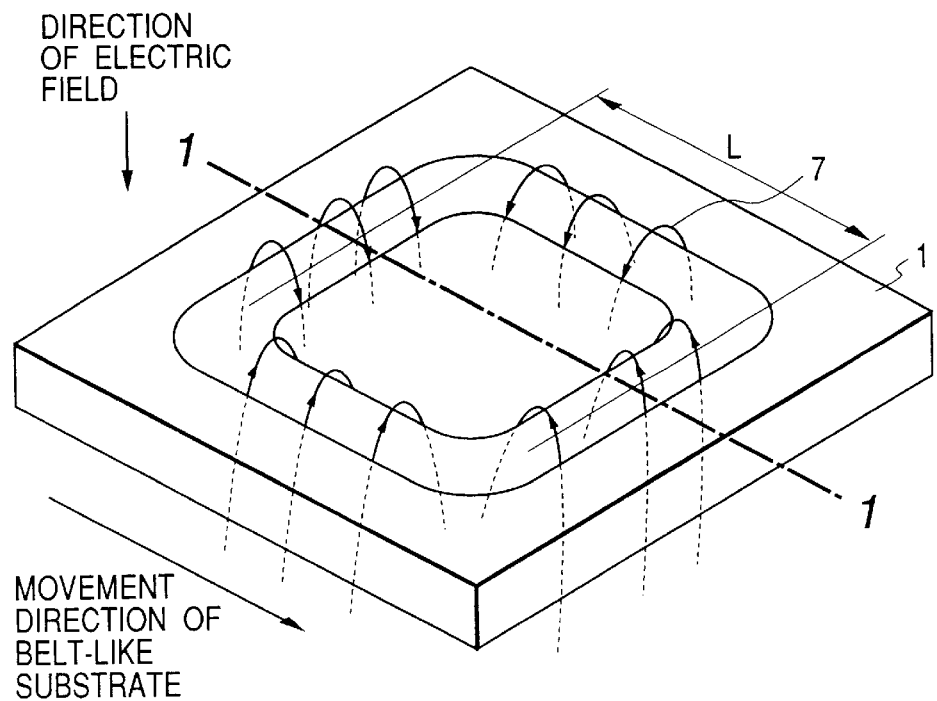
FIG. 2 is a schematically perspective view for showing a closed loop of a tunnel-like magnetic flux formed on a target.

FIG. 2 is a perspective view schematically illustrating an example of a target according to the present invention. FIG. 1 is a cross-sectional view for showing an example of a cathode unit and showing a cross section of the target, taken along the line 1—1 of FIG. 2. A target 1 is disposed on a target cooling plate 2 such that they are in intimate contact with each other and such that the target 1 is properly spaced from a belt-like substrate 10. At the back side of the cooling plate 2, there is disposed a magnet assembly 6 including permanent magnets 3 and 4 and a permanent magnet supporting member 5. In this embodiment, the magnets 3 are disposed on the periphery of the supporting member 5 such that the same magnetic poles are directed to the upper side and the magnet 4 is disposed at the center of the supporting member 5 so that its magnetic pole is opposite in polarity to that of the magnet 3. The magnets may be either of the permanent type or of the electromagnet type. The magnets may be disposed on the supporting member 5 without any space between them, if desired.

Because the magnetic poles of the magnets 3 and 4 on the side of the cooling plate 2 are opposite to each other, lines of magnetic force emerging from the magnet assembly 6 returns to the magnet assembly 6 after passing through the surface region of the target 1, whereby a closed loop of tunnel-like magnetic flux 7 is formed. To improve the utilization efficiency of the target 1, the magnet assembly 6 is moved along a circular path so that the tunnel-like magnetic flux is moved on the target (means for moving the magnet assembly is not shown in the drawings). A negative DC voltage or a high frequency voltage is applied to the target 1 (from a power supply not shown in the drawings) so that an electric field is formed in a direction perpendicular to the substrate and also to the target. In the above-described manner, a plasma is generated and the target is sputtered.

The shape of the magnetic flux on the surface of the target is shown in FIG. 2. As shown, a magnetic tunnel is formed with a magnetic flux 7 of a closed loop shape.

The belt-like substrate 10 is moved at a speed v. The tunnel-like magnetic flux is moved along a circular path with a period of T by the motion of the magnet assembly 6. The distance in the motion direction of the belt-like substrate between portions where the magnetic field of the tunnel-like magnetic flux and the electric field generated by the electric power applied to an electrode cross at a right angle is set to L.

Figure 3:
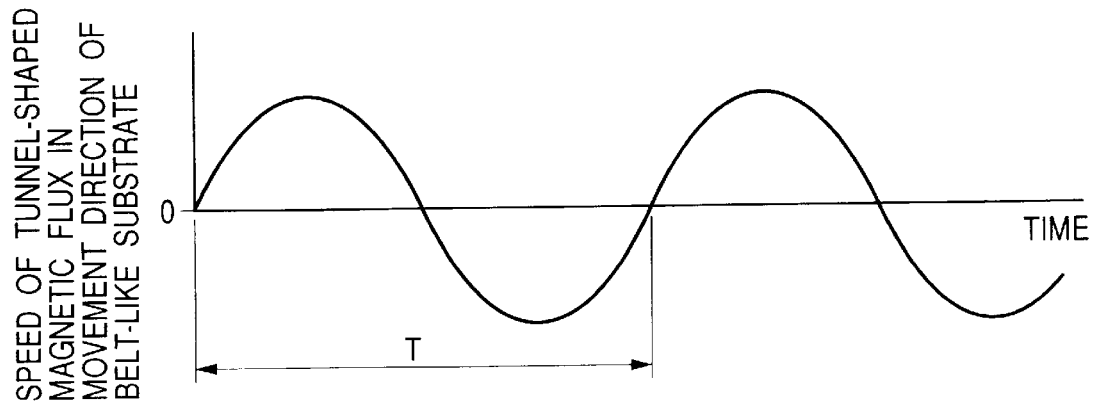
FIG. 3 is a graph illustrating the speed of a tunnel-like flux in the direction of conveying a belt-like substrate.

Because the magnet assembly 6 is moved along the circular path, the speed of moving the tunnel-like magnetic flux in the direction of moving the belt-like substrate varies as a sine wave shown in FIG. 3. In other words, the speed of the tunnel-like magnetic flux has alternately positive and negative values (herein the speed is defined as being positive in the same direction as the motion of the substrate). That is, the tunnel-like magnetic flux reciprocates in the longitudinal direction of the belt-like substrate.

In this invention, the reciprocating motion of the tunnel-like magnetic flux is controlled such that when the belt-like substrate moves a distance in the direction of moving the belt-like substrate between two adjacent points where which the magnetic field of the tunnel-like magnetic flux and the electric field formed between the target and the substrate cross each other at a right angle, the reciprocating motion of the tunnel-like magnetic flux becomes opposite in direction. More specifically in FIG. 1, the speed of moving the tunnel-like magnetic flux in the direction of the motion of the belt-like substrate when the belt-like substrate passes through the region A is substantially equal but opposite in direction to that when the belt-like substrate passes through the region B (at a position away from the region A by the distance L between two adjacent points where the magnetic field of the tunnel-like magnetic flux and the electric field between the target and the substrata cross each other at a right angle).

That is, the portion of the substrate which is located in the region A at a certain time will be located, after L/v hour, in the region B apart from the region A by a distance L. The reciprocating motion of the tunnel-like magnetic flux (FIG. 3) is preferably controlled so as to have about ½ of the phase in the region A. This requirement can be represented by an equation such that $L/v=(n+½)T$ wherein n is an integer equal to or greater than 0. When the above requirement is satisfied, the relative speed of the belt-like substrate with respect to the tunnel-like magnetic fluxes in the direction of the motion of the belt-like substrate can be regarded as a constant value for any part of the belt-like substrate over the whole target. In other words, any part of the belt-like substrate is subjected to sputtering for substantially the same sputtering time. In the above equation representing the condition which should be met to form an uniform film, n is allowed to have some deviation such as $z-1/16<n<z+1/16$ (wherein z is an integer equal to or greater than zero). In other words, a deviation within $±1/16$ of the period from the half-period is allowed.

In the present embodiment, the width of the substrate is sufficiently small compared with that of the magnet assembly, and thus no significant variation occurs in the width direction.

Second Embodiment

Figure 9:
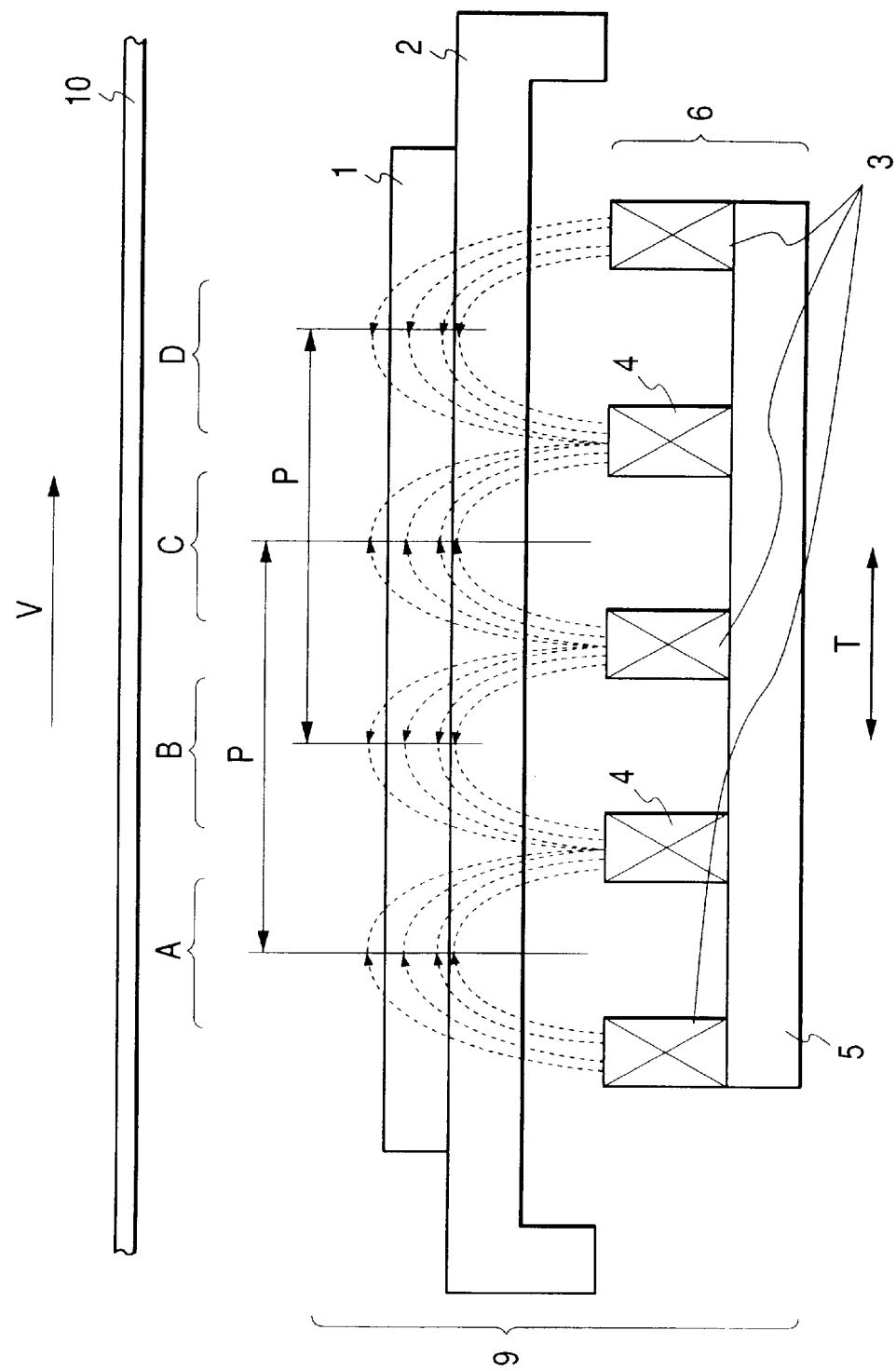
FIG. 9 is a schematically cross-sectional view for showing a cathode unit according to the invention.
Figure 10:
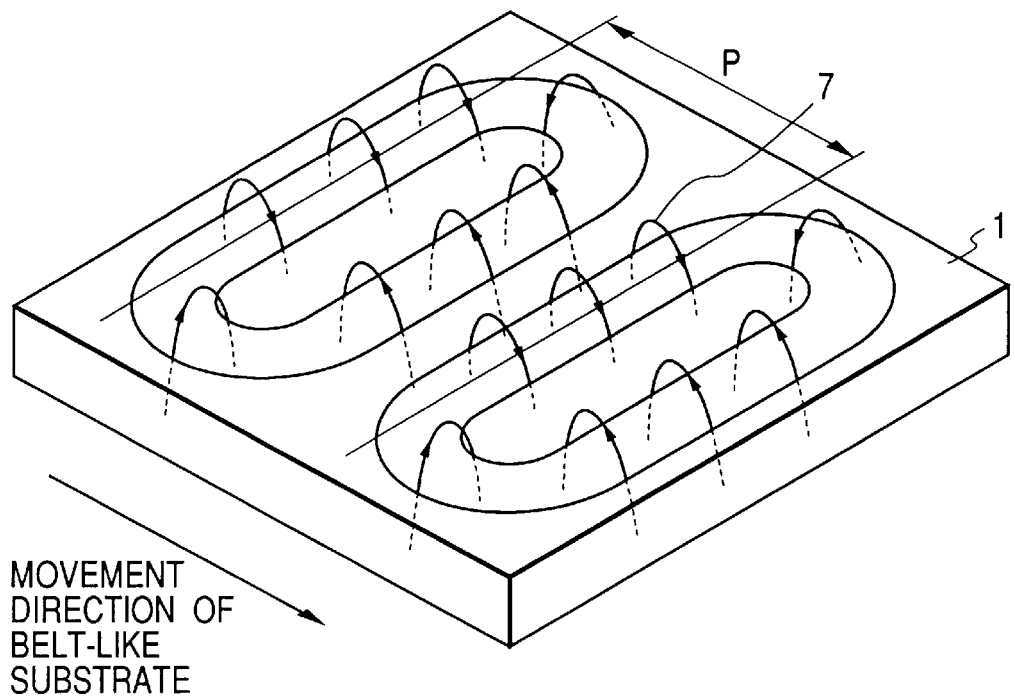
FIG. 10 is a schematically perspective view for showing closed loops of tunnel-like magnetic fluxes formed on a target.

FIG. 9 is a cross-sectional schematically illustrating another example of a cathode unit in which two tunnel-like magnetic fluxes are formed. In this cathode unit, as shown in FIG. 10, two closed loops of tunnel-like magnetic fluxes are formed on the surface of the target 1. This structure brings about more uniform erosion of the target and thus a higher utilization efficiency.

More specifically, the speed of the tunnel-like magnetic flux in the direction of the motion of the belt-like substrate when the belt-like substrate passes through the region A shown in FIG. 9 (wherein the magnetic field of the tunnel-like magnetic flux and the electric field between the target and the substrata cross each other at a right angle) is equal but opposite in direction to that when the belt-like substrate passes through the region C in FIG. 9 (wherein the magnetic field of the tunnel-like magnetic flux and the electric field between the target and the substrata cross each other at a right angle). That is, when the distance in the direction of the motion of the belt-like substrate between the two tunnel-like magnetic fluxes each of a closed loop shape is denoted by p, the period T of the reciprocating motion of the two tunnel-like magnetic fluxes on the target is controlled so as to satisfy $p/v=(n+½)T$ (wherein n is an integer equal to or greater than zero) to generate a phase difference of T/2.

Because the two tunnel-like magnetic fluxes each of a closed loop shape are similar in shape and apart from each other by distance p, the speed of the tunnel-like magnetic flux in the direction of the motion of the belt-like substrate when the belt-like substrate passes through the region B (wherein the magnetic field of the tunnel-like magnetic flux and the electric field between the target and the substrate cross each other at a right angle) is also equal but opposite in direction to that when the belt-like substrate passes through the region D (wherein the magnetic field of the tunnel-like magnetic flux and the electric field between the target and the substrata cross each other at a right angle). Thus, the relative speed of the belt-like substrate with respect to the tunnel-like magnetic fluxes in the direction of the motion of the belt-like substrate can be regarded as a constant value for any part of the belt-like substrate over the whole target. In other words, any part of the belt-like substrate is subjected to sputtering for substantially the same sputtering time.

Alternatively, the speed of the two tunnel-like magnetic fluxes of a closed loop shape may also be controlled such that the speed becomes equal but opposite in direction between the region A and the region B and also between the region C and the region D as is the case in the previous embodiment of using only one tunnel-like magnetic flux of a closed loop shape.

Although the present embodiment employs two tunnel-like magnetic fluxes each of a closed loop shape in each vacuum chamber, one cathode unit may also include three tunnel-like magnetic fluxes each of a closed loop shape. In this case, the rocking motion is controlled so as to generate a phase difference of T/3 between adjacent loops and thus thickness nonuniformity produced at the first tunnel-like magnetic flux is compensated by the second and third tunnel-like magnetic fluxes, thereby ensuring that the film thickness becomes uniform in the longitudinal direction of the belt-like substrate.

Furthermore, one cathode unit may include four tunnel-like magnetic fluxes each of a closed loop shape and the rocking motion may be controlled so as to generate a phase difference of T/4 between adjacent loops. In this case, nonuniformity of thickness produced at the first tunnel-like magnetic flux is compensated by the third tunnel-like magnetic flux, and nonuniformity of thickness produced at the second tunnel-like magnetic flux is compensated by the fourth tunnel-like magnetic flux, thereby ensuring that the film has improved uniformity of thickness in the longitudinal direction of the belt-like substrate. When the rocking motion is controlled so as to generate a phase difference of T/2 between adjacent loops, then nonuniformity of thickness produced at the first tunnel-like magnetic flux is compensated by the second tunnel-like magnetic flux, and nonuniformity of thickness produced at the third tunnel-like magnetic flux is compensated by the fourth tunnel-like magnetic flux.

More generally, one cathode unit may include a plurality of tunnel-like magnetic fluxes each of a closed loop shape. In this general case, the rocking motion is controlled such that $p/v=(n+1/m_1)T$ wherein n is an integer equal to or greater than zero, v is the conveying speed of the belt-like substrate, $m_1$ is a number of tunnel-like magnetic fluxes each of a closed loop shape in the same cathode unit for canceling nonuniformity of thickness, p is the pitch of the tunnel-like magnetic fluxes each of a closed loop shape arranged in the direction of the motion of the belt-like substrate, and T is the period of the rocking motion of the tunnel-like magnetic fluxes each of a closed loop shape. In the above equation representing the condition required to achieve good uniformity of film thickness, a value of n may not always is an integer, but it must be within the range of $z-1/(8m_1)<n<z+1/(8m_1)$ (wherein z is an integer equal to or greater than zero).

Figure 4:
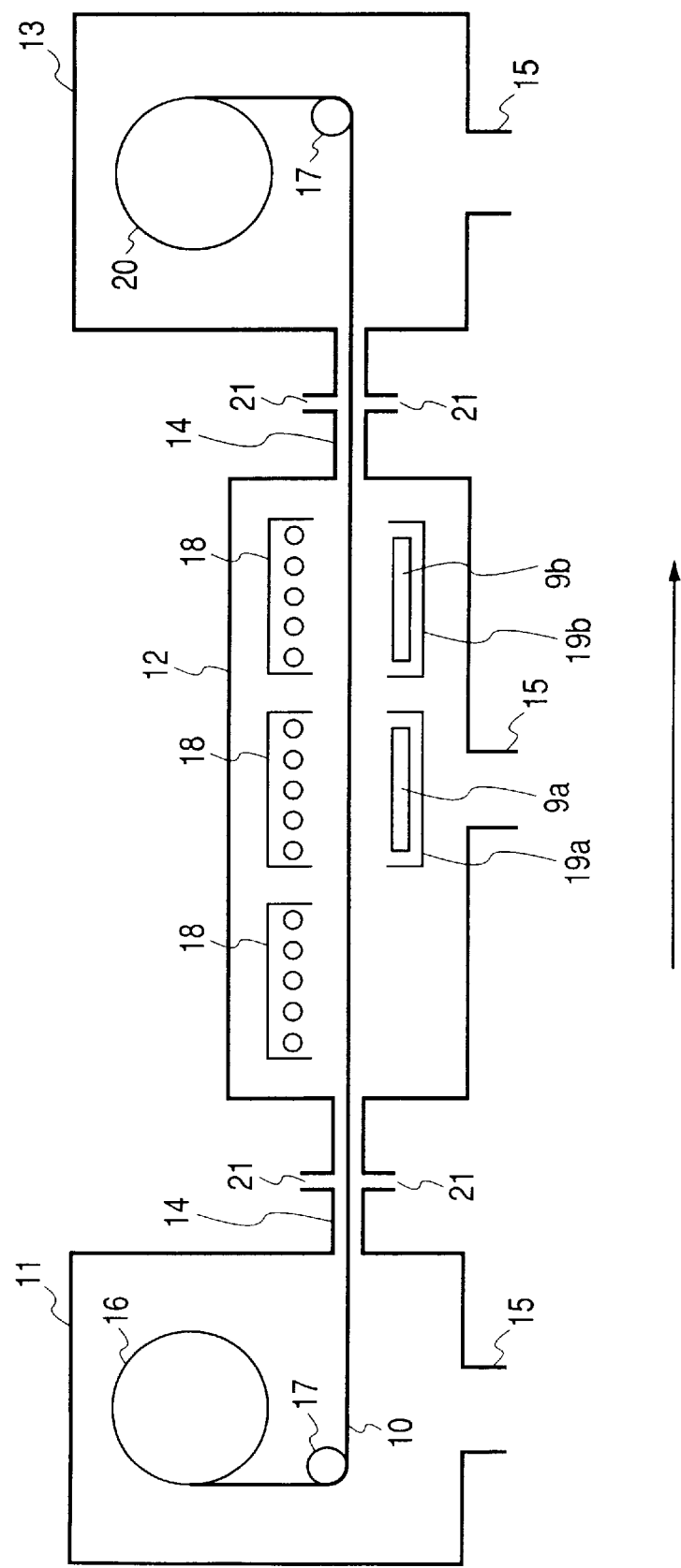
FIG. 4 is a schematically cross-sectional view for showing a roll-to-roll system sputtering apparatus according to the present invention.

FIG. 4 is a schematic view for illustrating an example of a sputtering apparatus according to the present invention. In this apparatus, a substrate feeding vacuum chamber 11, a film formation vacuum chamber 12, and a substrate wind-up vacuum chamber 13 are connected from chamber to chamber via a gas gate 14, and evacuated via an exhaust vent 15 by a vacuum pump (not shown in the drawing). A belt-like substrate 10 wound around a reel 16 is fed into the film formation vacuum chamber 12 along the direction as shown by the arrow in FIG. 4 after the conveying direction is changed by a transfer roller 17. In the film formation vacuum chamber 12, the belt-like substrate 10 is heated by a lamp heater 18 to a predetermined film formation temperature. In film formation regions 19a and 19b, films are formed on the belt-like substrate 10 by cathode units 9a and 9b provided with various targets. Each cathode unit 9a and 9b has a structure such as that shown in FIG. 1 or 9 for forming similar tunnel-like magnetic fluxes on the surfaces of the respective targets and can be rocked as described above. After completion of the film formation, the belt-like substrate 10 is conveyed into the substrate wind-up vacuum chamber 13 and wound around a wind-up reel 20 wherein the conveying direction of the belt-like substrate 10 is changed by a conveying roller 17 in the middle of the conveying path. A purge gas is supplied through a purge gas supply line 21 and is passed through the gas gates 14 so as to prevent the vacuum chambers from being contaminated with a gas from other vacuum chambers.

Although in the above embodiments the magnet assembly for generating the magnetic field is mechanically moved along a circular path, the present invention is not limited thereto. The magnet assembly may be moved in any manner as long as the motion of the magnet assembly causes the tunnel-like magnetic flux of a closed loop shape to periodically move on the target in the direction of motion of the substrate. For example, the magnet assembly may be moved in a simply reciprocating manner in the conveying direction of the substrate.

Third Embodiment

FIG. 11 is a cross-sectional view illustrating another embodiment of a sputtering apparatus according to the present invention. Film formation regions 19a and 19b are provided in a vacuum chamber 12a. Similarly, film formation regions 19c and 19d are provided in a vacuum chamber 12b. Cathode units 9a and 9b are disposed in the film formation regions 19a and 19b, respectively, and cathode units 9c and 9d are disposed in the film formation regions 19c and 19d, respectively. The same kind of film is formed in the film formation regions 19a and 19b which work in cooperation with each other. Similarly, another film is deposited in the film formation regions 19c and 19d which work in cooperation with each other. The cathode units are disposed such that each of a distance between the centers of the cathode units 9a and 9b and a distance between the centers of the cathode units 9c and 9d is d. Each cathode unit 9a, 9b, 9c, and 9d has a structure such as that shown in FIG. 1 or 9, and can be moved independently along a circular path.

Because the magnet assemblies 5 are moved along circular paths, the speed of the tunnel-like magnetic fluxes varies as a sine wave in the direction of moving the belt-like substrate, as shown in FIG. 3, and the speed of the tunnel-like magnetic flux has alternately positive and negative values. That is, the tunnel-like magnetic fluxes reciprocates in the longitudinal direction of the belt-like substrate. The reciprocating motion is preferably controlled such that when a certain point of the belt-like substrate comes from the cathode unit 9a to the cathode unit 9b, the reciprocating motion of the tunnel-like magnetic flux formed by the cathode unit becomes opposite in the direction.

More specifically, the motion of the cathode units 9a and 9b is controlled by a speed controller 30a such that $d/v=(n+\frac{1}{2})T$, that is, there is a phase difference equal to half the rocking period T between the cathode units 9a and 9b, in other words, such that when the belt-like substrate 10 passes over the first cathode unit 9a, a periodic variation in film thickness in the longitudinal direction of the belt-like substrate 10 is produced, this variation in film thickness is compensated by a thickness variation produced when the belt-like substrate 10 passes over the second cathode unit 9b. Similarly, the motion of the cathode units 9c and 9d is controlled by a speed controller 30b. The other parts of the apparatus are similar to those of the apparatus shown in FIG. 4.

Although in the present embodiment, two cathode units are disposed in each vacuum chamber, three cathode units may be disposed in each vacuum chamber. In this case, the motion of cathode units is controlled such that there is a phase difference equal to ⅓ of the rocking period among the cathode units and thus nonuniformity of thickness produced at the first cathode unit is compensated by the second and third cathode units, thereby ensuring that the film has improved uniformity of thickness in the longitudinal direction of the belt-like substrate.

Furthermore, four cathode units may be disposed in a single vacuum chamber and the rocking motion may be controlled such that there is a phase difference of T/4 between adjacent cathode units. In this case, nonuniformity of thickness produced at the first cathode unit is compensated by the third cathode unit, and nonuniformity of thickness produced at the second cathode unit is compensated by the fourth cathode unit. When the rocking motion is controlled such that there is a phase difference of T/2 between adjacent cathod units, then nonuniformity of thickness produced at the first cathode unit is compensated by the second cathode unit, and nonuniformity of thickness produced at the third cathode unit is compensated by the fourth cathode unit.

More generally, a plurality of cathode units may be disposed in a single vacuum chamber. In this general case, the rocking motion is controlled such that $d/v=(n+1/m_2)T$ wherein n is an integer equal to or greater than zero, v is the conveying speed of the belt-like substrate, $m_2$ is the number of cathode units among which nonuniformity of thickness is canceled, d is the distance between adjacent centers of cathode units in the direction of the motion of the belt-like substrate, and T is the period of the rocking motion of the cathode units. In the above equation representing the condition required to achieve good uniformity of film thickness, provided that n may not always be an integer, but n must be within the range of $z-1/(8m_2)<n<z+1/(8m_2)$ (wherein z is an integer equal to or greater than zero).

The present invention is described in further detail below with reference to specific Examples. It should be understood that these Examples are intended to be illustrative only and that the invention is not limited to those Examples.

EXAMPLE 1

By using the apparatus shown in FIG. 4 including cathode units 9a and 9b of the type similar to the cathode unit 9 shown in FIG. 1, a back reflector including a thin Ag film and a thin ZnO film serving as a lower electrode and a light reflecting layer was formed using the tunnel-like magnetic flux of a closed loop as shown in FIG. 2. Semiconductor layers were further deposited thereon, and then a photovoltaic device were produced.

As the belt-like substrate 10, SUS430BA sheet (with a width of 120 mm, a length of 100 m, and a thickness of 0.13 mm) was employed. The belt-like substrate 10 was well degreased and cleaned. The cleaned belt-like substrate 10 was stretched between the two reels as shown in FIG. 4 and the tension was adjusted so that there is no slack. The apparatus was evacuated from exhaust vents 15 of the vacuum-tight chambers 11, 12, and 13 by a vacuum pump (not shown). The lamp heater 18 was then turned on so that the belt-like substrate 10 was heated to a film formation temperature of 400° C. Ar gas serving as a purging gas was introduced via the purge gas supply inlets 21. Ar gas serving as a sputtering gas was then supplied at a flow rate of 50 sccm into the respective film formation regions 19a and 19b via a source gas supply line (not shown). The conductance was reduced by closing a main valve (not shown) so that the pressure is maintained at a film formation pressure of $2.0 \times 10^{-3}$ Torr.

While moving the substrate, a negative DC voltage was applied from an external DC power supply (not shown) to the cathode unit 9a on which a Ag target was loaded and also to the cathode unit 9b on which a ZnO target was loaded to generate a discharge and successively depositing, by means of sputtering, a thin Ag film and a thin ZnO film on the substrate. After completion of the film deposition, the substrate was wound around the wide-up reel 12. Thus, the substrate with a back reflector was obtained.

In the above process, the belt-like substrate was moved at a conveying speed v of 200 mm/min, the magnet assembly was moved along the circular path with a period of 1 min, and the distance L in the direction of the motion of the belt-like substrate between portions where the magnetic field of the tunnel-like flux and the electric field generated by electric power applied between electrodes cross at a right angle was set to 100 mm. The conveying speed of the belt-like substrate was detected, and the resultant value was fed back to an automatic control system so that the rocking period T of the magnet satisfied the condition $L/v=(n+\frac{1}{2})T$ (wherein n=0 in this Example). The conveying speed of the substrate was maintained at the fixed value with a fluctuation of less than 1%.

The belt-like substrate on which the back reflector was deposited in the above-described manner using the above apparatus was taken out of the roll-to-roll system apparatus, and cut into a plurality of sheets with a size of 5 cm×5 cm. A sheet of substrate was placed in a CVD apparatus with a single vacuum chamber, and an n-type non- single-crystal silicon semiconductor film, an i-type non-single-crystal silicon semiconductor film, and a p-type non-single-crystal silicon semiconductor film were successively deposited on the sheet of the substrate by means of CVD under the conditions shown in Table 1, thereby obtaining a multilayer structure of semiconductor layers, and the semiconductor device was completed.

TABLE 1

| Film (Thickness, nm) | Gas Flow Rate (sccm) | Pressure (Torr) | Discharge Power (W) | Substrate Temperature (set temp.) (° C.) |
|---|---|---|---|---|
| n-type non-single-crystal silicon (20) | $SiH_4$: 150 $PH_3$: 3 $H_2$: 1500 | 1.0 | RF (150) | 350 |
| i-type non-single-crystal silicon (400) | $SiH_4$: 60 $H_2$: 200 | 0.01 | Microwave (200) | 300 |
| p-type non-single-crystal silicon (20) | $SiH_4$: 5 1% $BF_3$: 1 $H_2$: 2000 | 1.0 | RF (700) | 250 |

Figure 5:
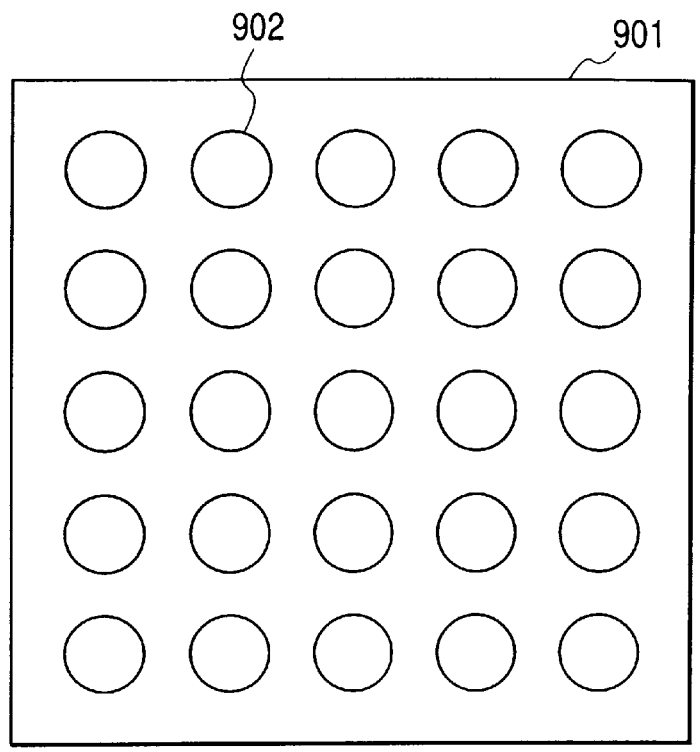
FIG. 5 is a schematic view for showing a mask for use in producing a transparent and electroconductive ITO film.
Figure 6:
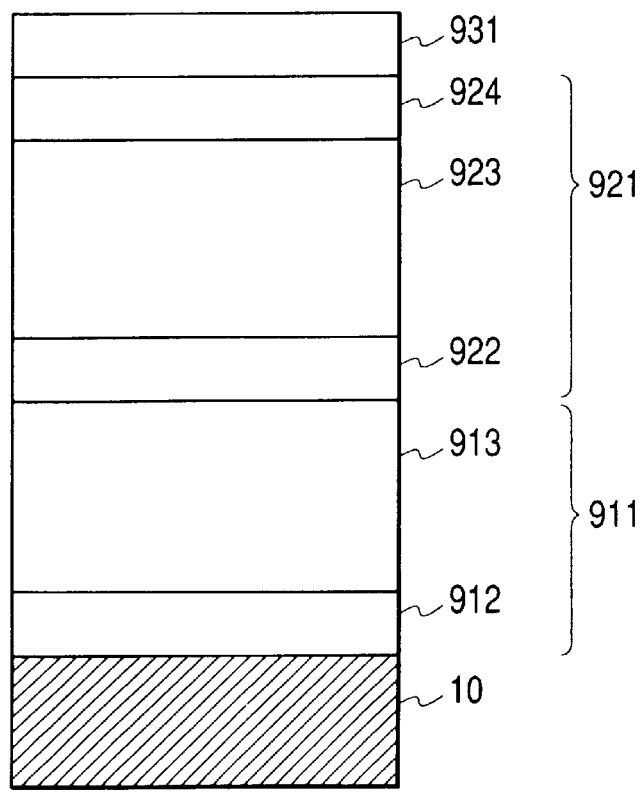
FIG. 6 is a schematically cross-sectional view for showing a photovoltaic device comprising a back reflector formed by means of the sputtering method according to the present invention.

The obtained substrate was put together with a stainless steel mask 901 having 25 openings 902 with a diameter of 6 mm as shown in FIG. 5, into a vacuum evaporation apparatus with a single vacuum chamber, and a transparent and electroconductive ITO (indium tin oxide) film was deposited on the semiconductor film through the openings 902 by means of vacuum evaporation under the conditions shown in Table 2, thereby producing a photovoltaic device having the structure whose cross section is schematically shown in FIG. 6.

TABLE 2

| Evaporation Source (Composition Ratio) | In-Sn Alloy (50:50) |
|---|---|
| Evaporation Ambient (Torr) | $O_2$: $3 \times 10^{-4}$ |
| Substrate Temperature (° C.) | 180 |
| Evaporation Rate (nm/sec) | 0.1 |
| Film Thickness (nm) | 70 |

As shown in FIG. 6, the obtained device had the belt-like substrate 10; the back reflector film 911 consisting of the thin Ag film 912 and the thin ZnO film 913; the semiconductor multilayer 921; and the transparent and electroconductive ITO film 931, wherein the semiconductor multilayer 921 consists of the n-type non-single crystal silicon semiconductor film 922, the i-type non-single-crystal silicon semiconductor film 923, and the p-type non-single-crystal silicon semiconductor film 924.

The obtained photovoltaic devices were evaluated. Very little variation in the short-circuit current (Jsc) in the conveying direction of the belt-like substrate was observed. As to only the back reflector film, interference color due to the nonuniform thickness of the ZnO film was not observed.

Figure 12:
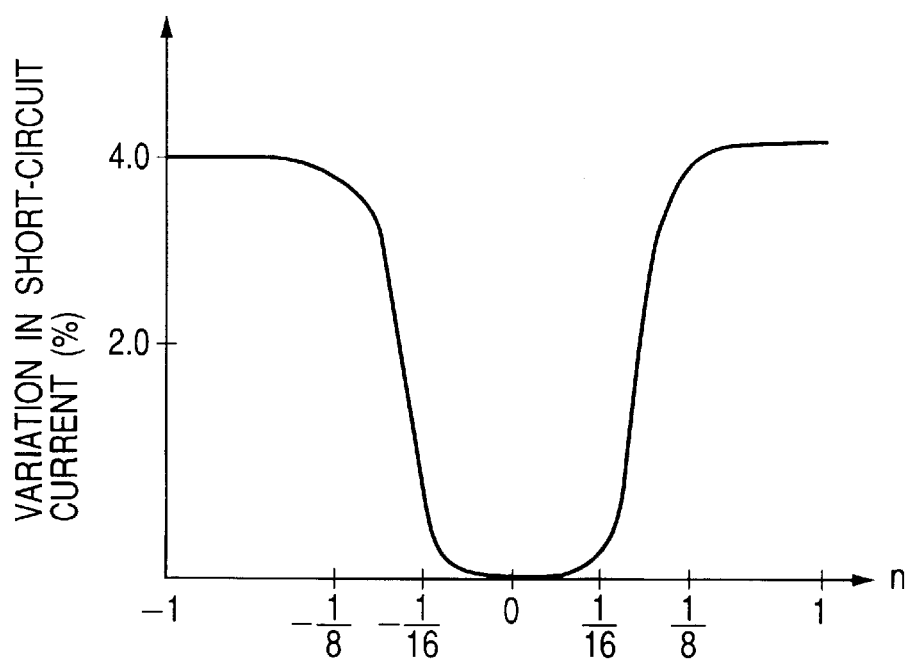
FIG. 12 is a graph for showing the relationship between the variation of a short-circuit current and n.

A similar experiment was performed but the rocking period T of the magnet assembly was shifted to various values from the ideal value satisfying $L/v=(n+\frac{1}{2})T$ (wherein n=0 in this experiment). The result is shown in FIG. 12. As can be seen from FIG. 12, very little variation in the short-circuit current and interference colors were observed when n was within the range of $n=0\pm\frac{1}{16}$. However, when n was out of the above range, large variation up to 4% in the short-circuit current were observed and periodic interference patterns caused by nonuniformity of film thickness were observed.

EXAMPLE 2

Photovoltaic devices comprising a thin ZnO film and a semiconductor multilayer structure were produced in the same manner as in Example 1 described above except that instead of the thin Ag film a thin Al film was deposited using an Al target as the target 1. In this Example, Al was deposited at room temperature, and ZnO was deposited at 150° C. (set temperature).

The obtained photovoltaic devices were evaluated. Very little variation in the short-circuit current (Jsc) in the conveying direction of the belt-like substrate was observed. As to only the back reflector film, interference color due to the nonuniform thickness of the ZnO film was not observed.

A similar experiment was performed but the rocking period T of the magnet assembly was shifted to various values from the ideal value satisfying $L/v=(n+\frac{1}{2})T$ (wherein n=0 in this experiment). The result was very similar to that of Example 1. That is, very little variation in the short-circuit current and interference colors were observed when n was within the range of $n=0\pm\frac{1}{16}$. However, when n was out of the above range, large variation up to 3% in the short-circuit current were observed and periodic interference patterns caused by nonuniformity of film thickness were observed.

EXAMPLE 3

Figure 7:
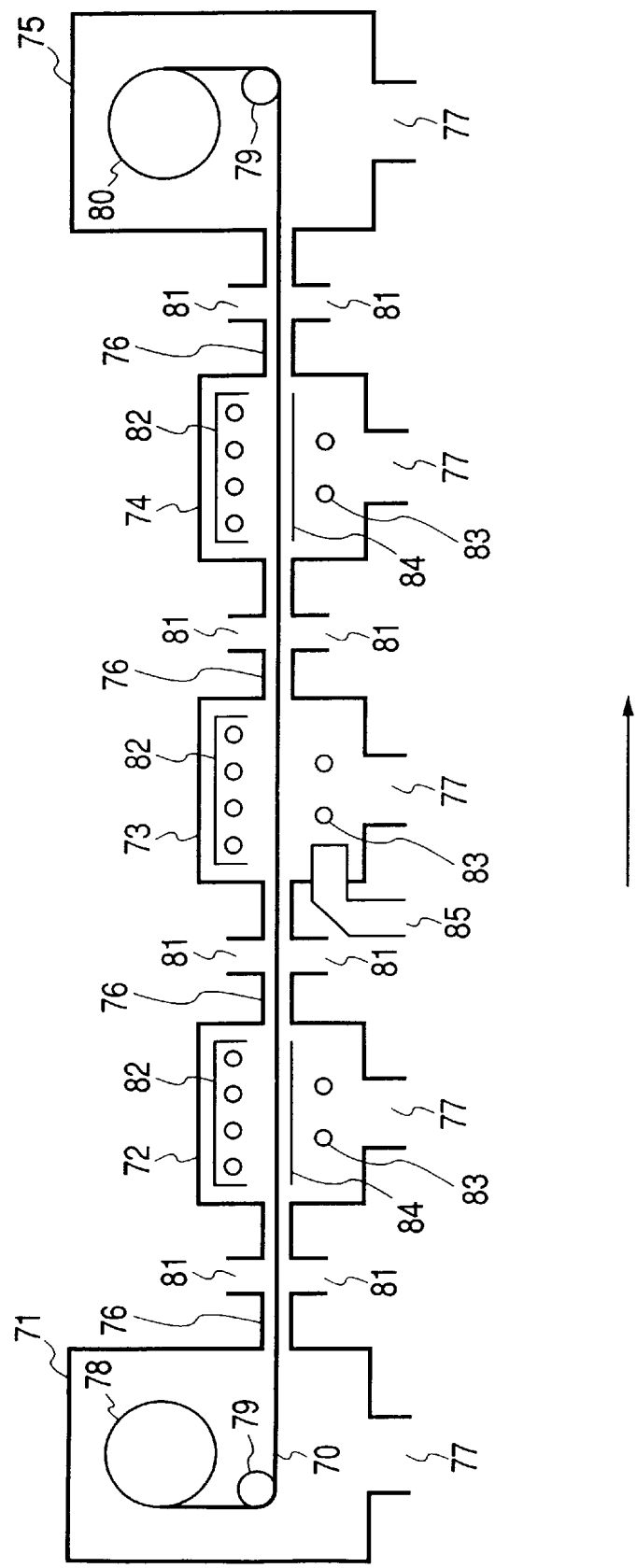
FIG. 7 is a schematically cross-sectional view for showing another roll-to-roll system sputtering apparatus according to the present invention.
Figure 8:
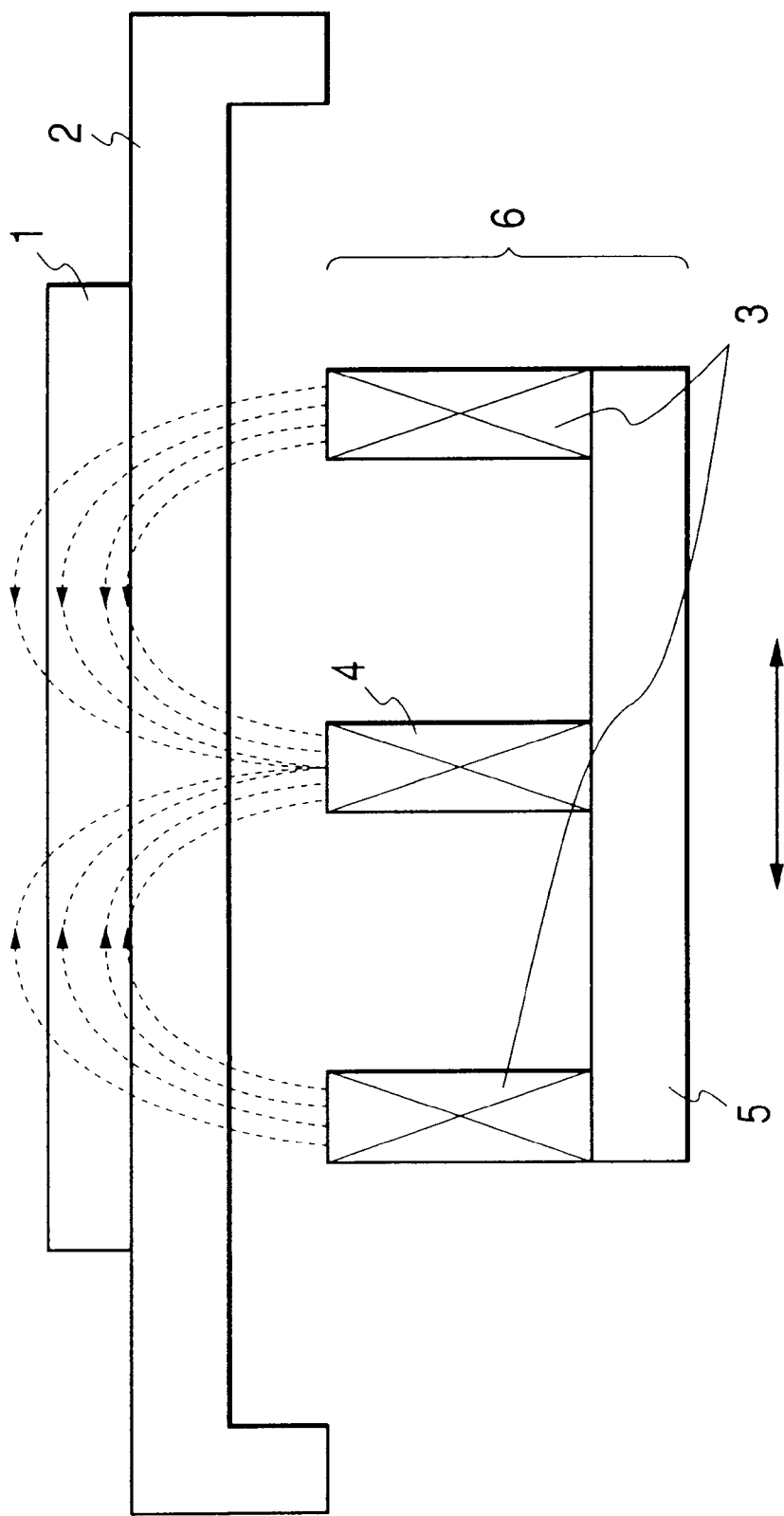
FIG. 8 is a schematically cross-sectional view for showing a cathode unit.

A thin Ag film and a thin ZnO film were deposited in the same manner as in Example 1, and a plurality of semiconductor films were successively deposited thereon using the apparatus shown in FIG. 7, thereby producing a photovoltaic device.

A back reflector film was first formed using the apparatus shown in FIG. 4 under the same conditions as those employed in Example 1. The belt-like substrate on which the back reflector film was formed was taken out of the apparatus shown in FIG. 4 and put into a roll-to-roll system CVD apparatus shown in FIG. 7.

The CVD apparatus shown in FIG. 7 includes a substrate feeding vacuum chamber 71, an n-type semiconductor layer deposition vacuum chamber 72, an i-type semiconductor layer deposition vacuum chamber 73, a p-type semiconductor layer deposition vacuum chamber 74, and a substrate wind-up vacuum chamber 75 which are connected from chamber to chamber via a gas gate 76. The CVD apparatus was evacuated through exhaust vents 77 by a vacuum pump (not shown). The belt-like substrate 70 on which the back reflector film was formed was wound around a feeding reel 78. The conveying direction of the belt-like substrate 70 wound around the feeding reel was changed by a conveying roller 79, and the substrate was fed into the n-type semiconductor layer formation vacuum chamber 72, then the i-type semiconductor layer formation vacuum chamber 73 and finally the p-type semiconductor layer formation vacuum chamber 74 (as shown by the arrow of FIG. 7). After completion of forming the films on the belt-like substrate 70 in the respective vacuum chambers, the belt-like substrate 70 was changed in the moving direction by a conveying roller 79 and wound around a wind-up reel 80. A purge gas was supplied through a purge gas supply line 81 and was passed through the gas gates 76, thereby preventing the vacuum chamber from being contaminated with gas from other vacuum chambers.

While evacuating the vacuum chambers 71 to 75 by a vacuum pump (not shown) via the exhaust vents 77, the substrate was heated in a respective vacuum chamber for forming a film to a predetermined temperature by lamp heaters 82. Furthermore, a film formation gas was introduced through a film formation gas inlet 83, and $H_2$ serving as the purge gas was introduced through the purge gas supply line 81. RF power with a frequency of 13.56 MHZ was applied to a discharging electrode 84, and microwave power with a frequency of 2.45 GHz was applied into the chamber 73 through microwave waveguide means 85, thereby generating a glow discharge in each chamber and forming films on the belt-like substrate 70 by means of CVD under the conditions shown in Table 3.

TABLE 3

| Film formation chamber | Film (Thickness, nm) | Gas Flow Rate (sccm) | Pressure (Torr) | Discharge Power (W) | Substrate Temperature (set temp.) (° C.) |
|---|---|---|---|---|---|
| 72 | n-type non-single-crytstl silicon (20) | $SiH_4$: 150 $PH_3$: 3 $H_2$: 1500 | 1 | RF (150) | 350 |
| 73 | i-type non-single-crystal silicon (400) | $SiH_4$: 60 $H_2$: 200 | 0.01 | Microwave (200) | 300 |
| 74 | p-type non-single crystal (20) | $SiH_4$: 5 1% $BF_3$: 1 $H_2$: 2000 | 1 | RF (700) | 250 |

The belt-like substrate 70 on which the non-single crystal silicon films were deposited in the above-described manner using the above apparatus was taken out of the roll-to-roll apparatus, and cut into a plurality of sheets with a size of 5 cm×5 cm. Furthermore, a transparent and electroconductive ITO film was formed thereon under the same conditions as those employed in Example 1 to produce photovoltaic devices.

The obtained photovoltaic devices were evaluated. Very little variation in the short-circuit current (Jsc) in the conveying direction of the belt-like substrate was observed. As to only the back reflector film, interference color due to the nonuniform thickness of the ZnO film was not observed.

A similar experiment was performed but the rocking period T of the magnet assembly was shifted to various values from the ideal value satisfying $L/v=(n+½)T$ (wherein n=0 in this experiment). Very little variation in the short-circuit current and interference colors were observed when n was within the range of $n=0±\frac{1}{16}$. However, when n was out of the above range, large variation up to 4% in the short-circuit current were observed, and periodic interference patterns caused by nonuniformity of film thickness were observed.

EXAMPLE 4

By using the apparatus shown in FIG. 4 including a cathode unit of the type similar to the cathode unit 9 shown in FIG. 9, a thin Ag film and a thin ZnO film were formed in the same manner as in Example 1 except that two closed loops of tunnel-like magnetic fluxes such as those shown in FIG. 10 were used. Semiconductor layers were further formed thereon and photovoltaic devices were produced. In the above process, the belt-like substrate was moved at a conveying speed v of 200 mm/min, the magnet assembly was moved along the circular path with a period of 30 sec, and the pitch p in the direction of the motion of the belt-like substrate between two tunnel-like fluxes was set to 50 mm. The conveying speed of the belt-like substrate was detected, and the resultant value was fed back to an automatic control system so that the rocking period T of the magnet satisfied the condition $p/v=(n+1/m_1)T$ (wherein $m_1=2$ and n=0).

A similar experiment was also performed but the rocking period T of the magnet assembly was shifted to various values from the ideal value satisfying $p/v=(n+1/m_1)T$ (wherein $m_1=2$ and n=0). Very little variation in the short-circuit current and interference colors were observed when n was within the range of $n=0±\frac{1}{16}$. However, when n was out of the above range, large variation up to 4% in the short-circuit current were observed and periodic interference patterns caused by nonuniformity of film thickness were observed.

EXAMPLE 5

Photovoltaic devices including a thin ZnO film and a semiconductor multilayer structure were produced in the same manner as in Example 4 described above except that instead of the thin Ag film a thin Al film was deposited using an Al target as the target 1. In this example, Al was deposited at room temperature, and ZnO was deposited at 150° C.

The obtained photovoltaic devices were evaluated. Very little variation in the short-circuit current (Jsc) in the conveying direction of the belt-like substrate was observed. As to only the back reflector film, interference color due to the nonuniform thickness of the ZnO film was not observed.

A similar experiment was performed but the rocking period T of the magnet assembly was shifted to various values from the ideal value satisfying $p/v=(n+1/m_1)T$ (wherein $m_1=2$ and $n=0$). Very little variation in the short-circuit current and interference colors were observed when n was within the range of $n=0\pm\frac{1}{16}$. However, when n was out of the above range, large variation up to 3% in the short-circuit current were observed and periodic interference patterns caused by nonuniformity of film thickness were observed.

EXAMPLE 6

A thin Ag film and a thin ZnO film were deposited in the same manner as in Example 4, and a plurality of semiconductor films were successively deposited thereon using the apparatus shown in FIG. 7, thereby producing photovoltaic devices.

The obtained photovoltaic devices were evaluated. Very little variation in the short-circuit current (Jsc) in the conveying direction of the belt-like substrate was observed. As to only the back reflector film, interference color due to the nonuniform thickness of the ZnO film was not observed.

A similar experiment was also performed but the rocking period T of the magnet assembly was shifted to various values from the ideal value satisfying $p/v=(n+1/m_1)T$ (wherein $m_1=2$ and $n=0$). Very little variation in the short-circuit current and interference colors were observed when n was within the range of $n=0\pm\frac{1}{16}$. However, when n was out of the above range, large variation up to 3% in the short-circuit current were observed and periodic interference patterns caused by nonuniformity of film thickness were observed.

EXAMPLE 7

Using the apparatus shown in FIG. 11, a back reflector including a thin Ag film and a thin ZnO film serving as a lower electrode and a light reflecting layer was formed. Semiconductor layers were further formed thereon, thereby producing photovoltaic devices.

As the belt-like substrate 10, SUS430BA sheet (with a width of 120 mm, a length of 100 m, and a thickness of 0.13 mm) was employed. The belt-like substrate 10 was well degreased and cleaned. The cleaned belt-like substrate 10 was stretched between the two reels as shown in FIG. 11 and the tension was adjusted such that there is no slack. The apparatus was evacuated from exhaust vents 15 of the vacuum chambers 11, 12a, 12b, and 13 by using a vacuum pump (not shown). The belt-like substrate 10 was heated to a formation temperature of 400° C. using lamp heaters 18. Ar gas serving as a purging gas was introduced via the purge gas supply inlets 21. Ar gas serving as a sputtering gas was then supplied at a flow rate of 50 scam into the respective film formation regions 19a, 19b, 19c, and 19d via a source gas line (not shown). The conductance is reduced by closing a main valve (not shown) so that the pressure is maintained at a film formation pressure of $2.0\times10^{-3}$ Torr. A negative DC voltage was applied from an external DC power supply (not shown) to the cathode units 9a and 9b on which a Ag target was loaded and also to the cathode units 9c and 9d on which a ZnO target was loaded so as to generate a discharge, thereby successively depositing, by means of sputtering, a thin Ag film and a thin ZnO film on the substrate. After completion of the film deposition, the substrate was wound around the wind-up reel 20. Thus, a back reflector film was obtained.

In the above process, the belt-like substrate was moved at a conveying speed v of 400 mm/min, the two cathode units 9a and 9b (9c and 9d) on which the same kind of target was loaded were disposed such that the pitch d between them becomes 450 mm, and the magnet assemblies were moved with a period of 15 sec, The motion of the assemblies was controlled by the controller 30a and 30b such that the condition $p/v=(n+1/m_2)T$ (wherein $m_2=2$ and $n=4$) was satisfied.

The belt-like substrate on which the back reflector was deposited in the above-described manner using the above apparatus was taken out of the roll-to-roll apparatus, and photovoltaic devices having the structure schematically shown in the cross-sectional view of FIG. 6 were produced in the same manner as in Example 1.

The obtained photovoltaic devices were evaluated. Very little variation in the short-circuit current (Jsc) in the conveying direction of the belt-like substrate was observed. As to only the back reflector film, interference color due to the nonuniform thickness of the ZnO film was not observed.

A similar experiment was performed but the rocking period T of the magnet assemblies was shifted to various values from the ideal value satisfying $p/v=(n+1/m_2)T$ (wherein $m_2=2$ and $n=4$). Very little variation in the short-circuit current and interference colors were observed when n was within the range of $n=4\pm\frac{1}{16}$. However, when n was out of the above range, large variation up to 4% in the short-circuit current were observed and periodic interference patterns caused by nonuniformity of film thickness were observed.

EXAMPLE 8

Photovoltaic devices including a thin ZnO film and a semiconductor multilayer structure were produced in the same manner as in Example 7 described above except that instead of the thin Ag film a thin Al film was deposited using an Al target as the target 1. In this Example, Al was deposited at room temperature, and ZnO was deposited at 150° C.

The obtained photovoltaic devices were evaluated. Very little variation in the short-circuit current (Jsc) in the conveying direction of the belt-like substrate was observed. As to only the back reflector film, interference color due to the nonuniform thickness of the ZnO film was not observed.

A similar experiment was performed but the rocking period T of the magnet assembly was shifted to various values from the ideal value satisfying $p/v=(n+1/m_2)T$ (wherein $m_2=2$ and $n=4$). Very little variation in the short-circuit current and interference colors were observed when n was within the range of $n=4\pm\frac{1}{16}$. However, if n was out of the above range, large variation up to 3% in the short-circuit current were observed and periodic interference patterns caused by nonuniformity of film thickness were observed.

EXAMPLE 9

A thin Ag film and a thin ZnO film were deposited in the same manner as in Example 7, and a plurality of semiconductor films were successively deposited thereon by using the apparatus shown in FIG. 7, thereby producing photovoltaic devices.

The obtained photovoltaic devices were evaluated. Very little variation in the short-circuit current (Jsc) in the conveying direction of the belt-like substrate was observed. As to only the back reflector film, interference color due to nonuniform thickness of the ZnO film was not observed.

A similar experiment was performed but the rocking period T of the magnet assemblies was shifted to various values from the ideal value satisfying $p/v=(n+1/m_2)T$ (wherein $m_2=2$ and $n=4$). Very little variation in the short-circuit current and interference colors were observed when n was within the range of $n=4\pm\frac{1}{16}$. However, when n was out of the above range, large variation up to 4% in the short-circuit current were observed and periodic interference patterns caused by nonuniformity of film thickness were observed.

As can be understood from the above description, the present invention has the advantage that when a functional deposition film is formed using a roll-to-roll apparatus, a film with a uniform thickness can be continuously deposited with a high efficiency in using a target.

What is claimed is:

1. A sputtering method for depositing a film comprising the steps of:

forming a plurality of magnetic fluxes on a target;

forming an electric field between the target and a substrate;

conveying the substrate during film deposition while reciprocating the plurality of magnetic fluxes at least in the direction of conveying the substrate; and controlling (i) the speed v of conveying the substrate, (ii) the distance L in the direction of conveying the substrate between two adjacent points where the magnetic field of the plurality of magnetic fluxes and the electric field cross each other at a right angle, and (iii) the period T of a reciprocating motion of the plurality of magnetic fluxes so as to satisfy the formula $L/v=(n+\frac{1}{2})T$, wherein n is in accordance with the formula $z-\frac{1}{16}<n<z+\frac{1}{16}$, and z is an integer equal to or greater than 0.

2. A sputtering method for depositing a film comprising the steps of:

forming a plurality of magnetic fluxes of a closed loop shape on a target;

forming an electric field between the target and a substrate;

conveying the substrate during film deposition while reciprocating the plurality of magnetic fluxes at least in the direction of conveying the substrate; and controlling (i) the speed v of conveying the substrate, (ii) the interval p of disposing the plurality of closed loops, and (iii) the period T of a reciprocating motion of the plurality of magnetic fluxes so as to satisfy the formula $p/v=(n+1/m_1)T$, wherein n is in accordance with the formula $z-1/(8m_1)<n<z+1/(8m_1)$, z is an integer equal to or greater than 0, and $m_1$ is a number of closed loops mutually canceling non-uniformity.

3. A sputtering method according to any one of claims 1 or 2, wherein the magnetic fluxes are moved along a circular path.

4. A sputtering method according to claim 1, wherein the magnetic fluxes form a closed loop on the target.

5. A sputtering method for depositing a film comprising the steps of:

forming a magnetic flux on a target;

forming an electric field between the target and a substrate;

conveying the substrate during film deposition while reciprocating the magnetic flux at least in the direction of conveying the substrate, wherein the target is present in plurality and the plurality of targets reciprocate independently of one another; and controlling (i) the speed v of conveying the substrate, (ii) the distance d between two adjacent centers of the plurality of independently reciprocating targets, and (iii) the period T of a reciprocating motion of the magnetic flux so as to satisfy the formula $d/v=(n+1/m_2)T$, wherein n is in accordance with the formula $z-1(8m_2)<n<z+1/(8m_2)$, z is an integer equal to or greater than 0, and $m_2$ is a number of targets mutually canceling non-uniformity.

6. A sputtering method according to claim 5, wherein the magnetic flux is moved along a circular path.

7. A sputtering method according to claim 5, wherein the magnetic flux forms a closed loop on the target.

* * * * *

UNITED STATES PATENT AND TRADEMARK OFFICE
CERTIFICATE OF CORRECTION

PATENT NO. : 6,093,290

DATED : July 25, 2000

INVENTOR(S): HIDEO TAMURA, ET AL.

It is certified that error appears in the above-identified patent and that said Letters Patent is hereby corrected as shown below:

COLUMN 1:
Line 57, "returns" should read --return--.

COLUMN 2:
Line 34, "bring" should read --brings--.
Line 35, "of" should read --of the--.

COLUMN 4:
Line 12, "returns" should read --return--.
Line 47, "where which" should read --where--.

COLUMN 5:
Line 10, "an" should read --a--.
Line 18, "cross-sectional" should read --cross-sectional view--.

COLUMN 6:
Line 44, "is" should read --be--.

COLUMN 7:
Line 43, "reciprocates" should read --reciprocate--.
Line 57, "produced, this" should read --produced, and this--.

COLUMN 8:
Line 47, "were" should read --was--.

UNITED STATES PATENT AND TRADEMARK OFFICE
CERTIFICATE OF CORRECTION

PATENT NO. : 6,093,290

DATED : July 25, 2000

INVENTOR(S): HIDEO TAMURA, ET AL.

It is certified that error appears in the above-identified patent and that said Letters Patent is hereby corrected as shown below:

COLUMN 9:
Line 1, "a Ag" should read --an Ag--.
Line 3, "depositing," should read --deposit,--.

COLUMN 10:
Line 31, "were" should read --was--.
Line 34, "were" should read --was--.
Line 56, "were" should read --was--.
Line 59, "were" should read --was--.

COLUMN 11:
Line 13, "crytsl" should read --crystal--.

COLUMN 12:
Line 30, "were" should read --was--.
Line 33, "were" should read --was--.
Line 58, "were" should read --was--.
Line 61, "were" should read --was--.

COLUMN 13:
Line 14, "were" should read --was--.
Line 17, "were" should read --was--.
Line 37, "were" should read --was--.
Line 40, "were" should read --was--.
Line 63, "scam" should read --sccm--.

UNITED STATES PATENT AND TRADEMARK OFFICE
CERTIFICATE OF CORRECTION

PATENT NO. : 6,093,290

DATED : July 25, 2000

INVENTOR(S): HIDEO TAMURA, ET AL.

It is certified that error appears in the above-identified patent and that said Letters Patent is hereby corrected as shown below:

COLUMN 14:
Line 2, "a Ag" should read --an Ag--.
Line 15, "15 sec," should read --15 sec.--.
Line 34, "were" should read --was--.
Line 37, "were" should read --was--.
Line 59, "were" should read --was--.
Line 62, "were" should read --was--.

COLUMN 15:
Line 13, "were" should read --was--.
Line 16, "were" should read --was--.

Signed and Sealed this

Eighth Day of May, 2001

*Attest:*

NICHOLAS P. GODICI

*Attesting Officer*  Acting Director of the United States Patent and Trademark Office